(12) United States Patent
Judge et al.

(10) Patent No.: US 6,194,877 B1
(45) Date of Patent: Feb. 27, 2001

(54) FAULT DETECTION IN A MOTOR VEHICLE CHARGING SYSTEM

(75) Inventors: Alan Francis Judge, Farmington Hills; John Francis Renehan, South Lyon; Zeljko Deljevic, Plymouth, all of MI (US)

(73) Assignee: Visteon Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/365,986

(22) Filed: Aug. 2, 1999

(51) Int. Cl.[7] ........................................ H02J 7/14
(52) U.S. Cl. ............................ 322/28; 322/36; 320/162
(58) Field of Search ........................... 322/17, 22, 23, 322/24, 28, 36, 18; 320/149, 156, 162

(56) References Cited

U.S. PATENT DOCUMENTS

| | | | |
|---|---|---|---|
| 4,275,344 | | 6/1981 | Mori et al. ............................ 322/28 |
| 4,276,577 | | 6/1981 | Gruson ................................. 361/91 |
| 4,316,134 | * | 2/1982 | Balan et al. .......................... 322/99 |
| 4,348,629 | * | 9/1982 | Sievers ................................. 322/99 |
| 4,349,854 | | 9/1982 | Mori et al. ............................ 361/21 |
| 4,471,287 | | 9/1984 | Morishita et al. .................... 322/99 |
| 4,583,036 | | 4/1986 | Morishita et al. .................... 320/39 |
| 4,618,811 | * | 10/1986 | Mashino et al. ...................... 322/28 |
| 4,670,705 | * | 6/1987 | Sievers et al. ........................ 322/28 |
| 4,755,737 | | 7/1988 | Komurasaki et al. ................ 322/99 |
| 5,151,647 | * | 9/1992 | Frantz ................................... 322/99 |
| 5,481,176 | * | 1/1996 | DeBiasi et al. ........................ 322/7 |
| 5,521,485 | * | 5/1996 | Vogelsberger ........................ 322/28 |
| 5,594,321 | * | 1/1997 | Kohl et al. ............................ 320/48 |
| 5,617,011 | * | 4/1997 | Hammer et al. ...................... 322/28 |
| 5,637,985 | * | 6/1997 | Kakizaki et al. ..................... 322/28 |
| 5,780,995 | * | 7/1998 | Maggioni et al. ...................... 322/8 |

* cited by examiner

*Primary Examiner*—Nicholas Ponomarenko
(74) *Attorney, Agent, or Firm*—Rhonda L. McCoy-Pfau

(57) ABSTRACT

A fault detection method is disclosed for a motor vehicle charging system including a generator and an electrical component coupled to receive electrical current from the generator. In one embodiment, the method comprises sensing a first voltage at an output of the generator and sensing a second voltage at the electrical component and, if the first voltage and the second voltage differ by more than a predetermined amount, reducing or suspending output of electrical current from the generator. One advantage of the method disclosed herein is in its ability to diagnose a fault in an electrical connection at the output of a motor vehicle generator, where the fault manifests itself as a high resistance connection.

20 Claims, 3 Drawing Sheets

FAULT DETECTION IN A MOTOR VEHICLE CHARGING SYSTEM

BACKGROUND OF THE INVENTION

1. Field of the Invention

The present invention relates to motor vehicle charging systems and, more particularly, to the detection of faults in such systems.

2. Description of the Related Art

In a motor vehicle charging system, the connection between the power output terminal of an alternator and the power distribution system of the vehicle can occasionally be faulty. Such a faulty connection can be due to improper connection at the vehicle assembly plant, corrosion of the connection due to aging, loosening of the connection over time, or other factors.

A faulty connection which results in a completely "open" circuit at the output of the alternator will become quite readily apparent to the driver of the vehicle as his battery loses charge. However, faulty connections which result, not in an open circuit but in a high resistance connection or an intermittently open circuit, may not as readily manifest themselves to the driver of the vehicle. Thus, a system and method for diagnosing these classes of faulty connections at the output of an alternator will prove advantageous. The charging system can take appropriate action in its operation, and the driver can be made aware of the fault and have the vehicle repaired.

SUMMARY OF THE INVENTION

An object of the present invention is to diagnose faults at the output of an alternator. More particularly, an object of the invention is to diagnose faults which manifest themselves as a high-resistance condition or an intermittently open-circuit condition.

In one aspect, the present invention provides a fault detection method for a motor vehicle charging system including a generator and an electrical component coupled to receive electrical current from the generator. The method comprises the step of sensing a first voltage at an output of the generator. The method further comprises the step of sensing a second voltage at the electrical component. In addition, the method comprises the step of comparing a difference of the first voltage and the second voltage to a predetermined voltage, the predetermined voltage indicative of a high resistance connection between the output of the generator and the component. If the difference is greater than the predetermined voltage, the method includes the step of reducing or suspending output of electrical current from the generator.

Another aspect of the present invention provides a fault detection method for a motor vehicle charging system including a generator and an electrical component coupled to receive electrical current from the generator. The method comprises sensing a first voltage at an output of the generator and sensing a second voltage at the electrical component. If the first voltage and the second voltage differ by more than a predetermined amount, the predetermined amount being a function of an output current of the generator, the method includes reducing or suspending output of electrical current from the generator.

In a third aspect, the present invention provides a fault detection method for a motor vehicle charging system including a generator, a voltage regulator operatively coupled to the generator, an electrical component coupled to receive electrical current from the generator and a powertrain controller. If the charging system has an operational fault, the method comprises providing a fault indicating signal from the voltage regulator to the powertrain controller indicative of the operational fault. If the signal intermittently indicates the operational fault, the method also includes providing a first charging system control signal from the powertrain controller to the voltage regulator to limit or suspend output of the generator.

Designs according to the present invention provide the capability to diagnose alternator output connection faults which manifest themselves in a high-resistance, but not fully open circuit, condition. In doing so, the present invention provides advantages over alternative designs.

DETAILED DESCRIPTION OF THE PREFERRED EMBODIMENT

Figure 1:
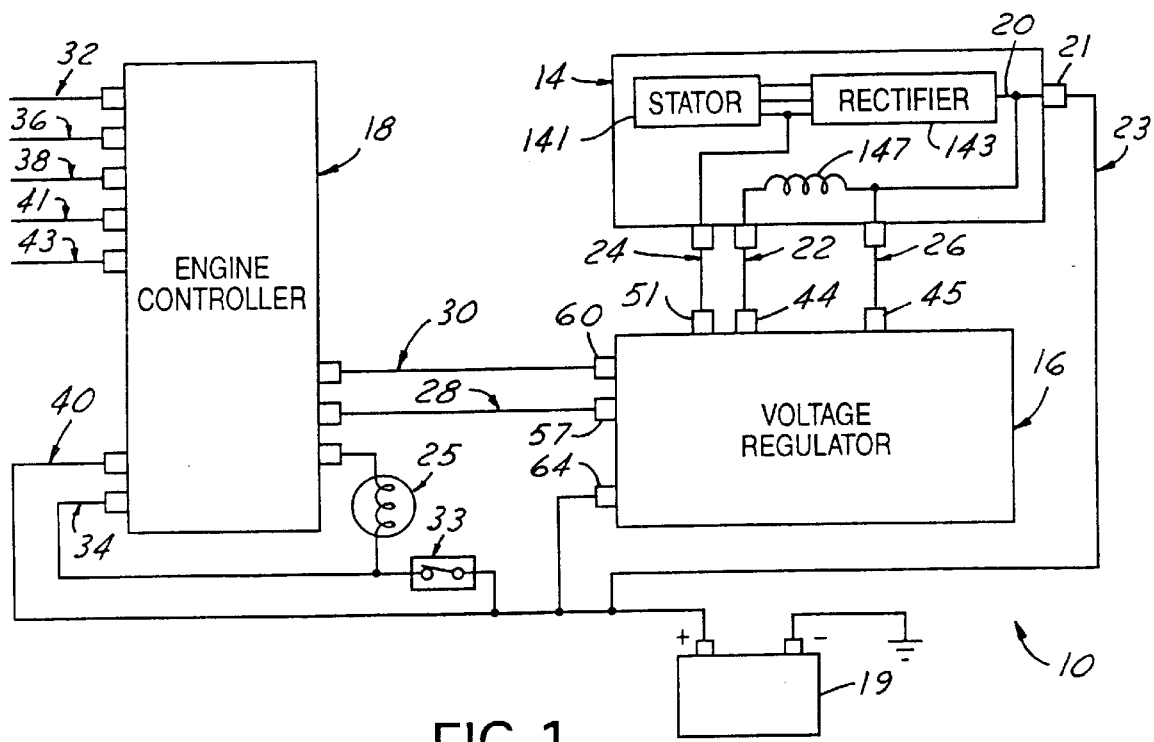
FIG. 1 is a schematic diagram of a motor vehicle charging system 10 according to one embodiment of the present invention.

Referring to FIG. 1, a charging system 10 according to one embodiment of the present invention is illustrated. Alternator 14 is a device which generates electrical energy in a motor vehicle. Alternator 14 is coupled to the vehicle's engine (not shown) to rotate along with engine rotation. Connected to alternator 14 is voltage regulator 16. Regulator 16 is responsible for trying to keep the output voltage of alternator 14 in regulation. Battery 19 is charged by current received from output 21 of alternator 14. Regulator 16 and alternator 14 are preferably physically coupled such that they form one unit which is installed on the engine when the engine is assembled.

Alternator 14 comprises a three-phase stator 141, as is contained in alternators known to the art. Stator 141 has three windings, the outputs of which are connected to rectifier 143. Rectifier 143 takes the three-phase alternating current power output from stator 141 and converts the power to direct current power for use by the motor vehicle. Rectifier 143 is preferably a six-diode full-wave bridge rectifier, well-known to those skilled in the art.

The output 20 of rectifier 143 is coupled to output terminal 21 of alternator 14. Further, output 20 of rectifier 143 is coupled to provide power for field coil 147.

Engine controller 18 is preferably a microprocessor-based device which contains sufficient microcomputer resources (memory, throughput, registers, inputs, outputs and the like) to perform the functions ascribed to it herein. Engine controller 18 has responsibility for a number of engine management functions including idle control and fuel injection control, as are many engine controllers known to the art.

In the present invention, engine controller 18 further has responsibility for determining the voltage to which regulator 16 should control the output of alternator 14.

Connecting regulator 16 and alternator 14 are three circuits. Field circuit 22 is the means by which regulator 16 controls the voltage output from alternator 14. Regulator 16 modulates the voltage on field circuit 22 to control field current in field coil 147 of alternator 14. Stator circuit 24 is a means by which regulator 16 verifies proper operation of alternator 14. Through stator circuit 24, regulator 16 can monitor whether alternator 14 is producing a voltage output. B+ circuit 26 is the third signal connecting alternator 14 to regulator 16.

Connecting regulator 16 and engine controller 18 are two circuits. Load indicator circuit 28 provides a pulse-width-modulated signal from regulator 16 to engine controller 18. The duty cycle of that signal is proportional to the duty cycle of the voltage at circuit 22 (i.e., the circuit which sinks current through field coil 147). The signal on load indicator circuit 28 provides engine controller 18 with a measure of the mechanical torque applied to the engine by alternator 14. It will be recognized by those skilled in the art that the torque applied to the engine by alternator 14 is a function of the current flowing though field coil 147.

Load indicator circuit 28 has a second function as well. If voltage regulator 16 detects a fault in the charging system, voltage regulator 16 pulls load indicator circuit 28 LOW continuously (that is, a 0% duty cycle). This indicates to engine controller 18 that a fault has occurred in the charging system. In a preferred embodiment of the present invention, load indicator circuit 28 has a duty cycle (percentage of time in the HIGH state) in the range of 6% to 97% during normal (non-fault) operation of alternator 14. The signal on load indicator circuit 28 preferably has a frequency of 125 Hz.

Regulator control circuit 30 is a means by which engine controller 18 can provide a command to regulator 16 indicating the voltage level at which regulator 16 should control alternator 14. The signal provided by engine controller 18 to regulator 16 on regulator control circuit 30 is pulse-width-modulated, the duty cycle of the signal being a function of the desired voltage command from engine controller 18 to regulator 16. Preferably, the duty cycle of the signal is generally proportional to the desired voltage command from engine controller 18 to regulator 16. Also preferably, the frequency of the signal on regulator control circuit is 125 Hz.

Charging system warning lamp 25 is connected between ignition switch 33 and engine controller 18. Engine controller 18 illuminates warning lamp 25 in the event that engine controller 18 learns from voltage regulator 16 via load indicator circuit 28 that a fault has occurred in the charging system. The vehicle's driver is thus informed of the malfunction in his charging system.

Figure 2:
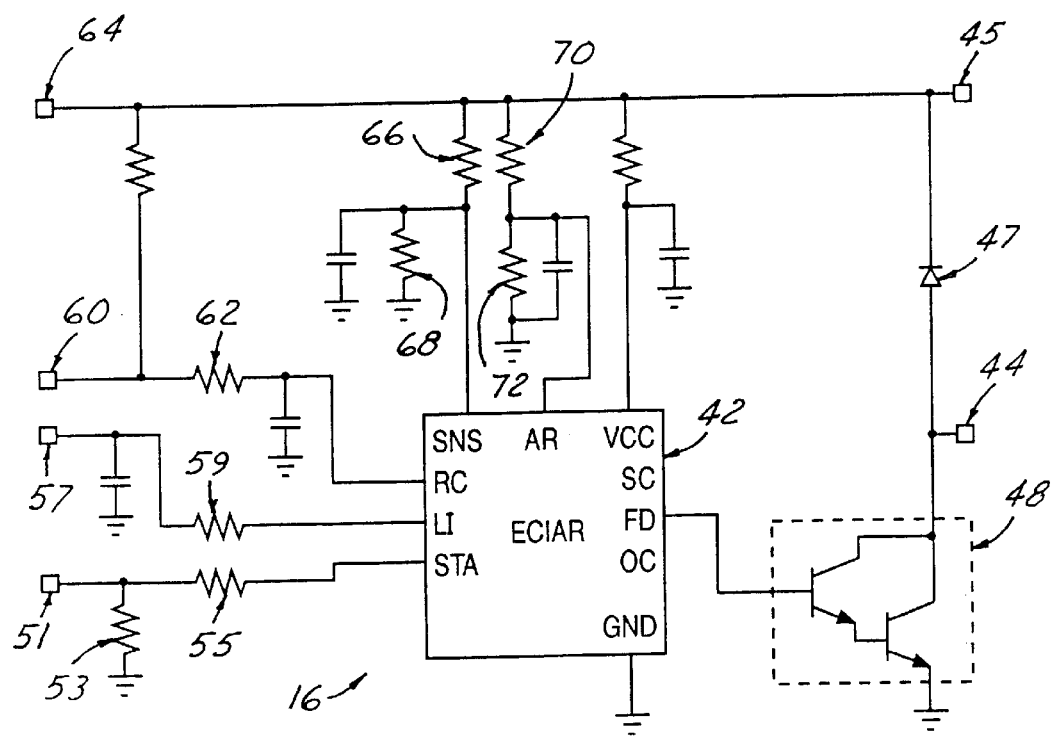
FIG. 2 is a schematic diagram of voltage regulator 16 of FIG. 1.

The interior of regulator 16 will now be described with additional reference to FIG. 2. Regulator 16 includes integrated circuit (IC) 42. IC 42 is known as an "Externally-Controlled Integral Alternator Regulator" (ECIAR) chip and is manufactured by Motorola Corporation.

Field terminal 44 is connected to the collector of Darlington transistor 48. Darlington transistor 48 is the means by which current is modulated in the field coil of alternator 14 for control of the output voltage of alternator 14. The base of Darlington transistor 48 is connected to pin "FD" of IC 42. Pin "FD" turns Darlington transistor 48 ON and OFF.

Regulator 16 contains recirculation diode 47. By examination of FIGS. 1 and 2, it is apparent that recirculation diode 47 is connected across field coil 147. The purpose of recirculation diode 47, as is known in the art, is to clamp the voltage across field coil 147 as field coil 147 is turned ON and OFF by regulator 16. Clamping of the voltage by recirculation diode 47 prevents large swings in field current as field coil 147 is turned ON and OFF. Recirculation diode 47 is also called a "flyback diode" by some people in the art.

Stator terminal 51 of regulator 16 is connected to ground via resistor 53 and to pin "STA" of IC 42 via resistor 55. As has been previously mentioned, stator terminal 51 is connected to one winding of the stator of alternator 14. Unless an alternating voltage (characteristic of the output of one phase of three-phase alternator 14) is seen at pin "STA", a fault is indicated.

Load indicator terminal 57 of regulator 16 is connected via resistor 59 to pin "LI" of IC 42. Pin "LI" has the ability to sink current, thereby being able to pull load indicator terminal 57 LOW. In this way, pin "LI" can create a pulse-width-modulated load-indicating signal at load indicator terminal 57, which is read by engine controller 18. The signal at pin "LI" is essentially contemporaneous with the signal at pin "FD", which drives field coil 147 via Darlington transistor 48 as discussed above. Pin "LI" also has the ability, previously discussed, to hold load indicator terminal 57 LOW continuously. In this way, regulator 16 indicates to engine controller 18 that a charging system fault has been detected by regulator 16.

Terminal 60 of regulator 16 is connected via resistor 62 to pin "RC" of IC 42. As has been previously mentioned, terminal 60 is an input to regulator 16 for the voltage command from engine controller 18 on circuit 30. The signal fed via terminal 60 to pin "RC" is also used to "wake up" IC 42. IC 42 goes into a quiescent state when the vehicle is not being operated and the charging system is not needed. IC 42 "wakes up" when it sees the pulse width modulated signal provided from engine controller 18 on circuit 30.

Terminal 64 of regulator 16 is connected via a voltage divider comprising resistors 66 and 68 to pin "SNS" of IC 42. Terminal 64 is also connected to battery 19, in order for regulator 16 to sense the voltage of battery 19.

Terminal 45 of regulator 16 is connected via a voltage divider comprising resistors 70 and 72 to pin "AR" of IC 42. Terminal 45 is also connected to output 20 of rectifier 142, in order to sense the output voltage of alternator 14.

One skilled in the art will also recognize that a microprocessor can be substituted for IC 42 within regulator 16. Such a microprocessor can be programmed with software and provided with appropriate microcomputer resources (inputs, outputs, registers, memory and the like) to perform the functions of IC 42.

A faulty connection between terminal 21 and conductor 23 can manifest itself in a high electrical resistance at that connection. This, in turn, manifests itself in a relatively high voltage drop across that connection. Thus, to diagnose a high-resistance connection, voltage regulator 26 performs the routine illustrated in FIG. 3. At step 302, voltage regulator 26 measures the voltage at the positive terminal of battery 19. At step 304, voltage regulator 26 determines whether the charging system is operating "within regulation" by comparing the voltage at battery 19 to a regulation threshold (typically 13.5 volts). If the battery voltage is below that threshold, it is inferred that the alternator is operating at "full field" (i.e., Darlington transistor 48 is fully "ON" to try to increase the output of the alternator). In this case, the output current of the alternator is likely to be quite high, with a correspondingly high voltage drop across the connection between terminal 21 and conductor 23. In order to prevent false indications of a high-resistance fault, the fault detection routine of FIG. 3 returns to step 302 under this circumstance.

If, alternatively, the answer at step 304 is NO, the voltage at output 20 of rectifier 143 is measured (step 306). At step 308, the two measured voltages are compared. If they are greater than a threshold voltage, it is determined that a high-resistance connection exists between output terminal 21 and conductor 23. This determination can be made because given Ohm's law, a higher resistance between output terminal 21 and conductor 23 will cause a greater voltage drop across that connection. The threshold voltage may be, for example, about 0.5 to 0.7 volts. The difference in voltages with an open circuit fault between output terminal 21 and conductor 23 would, by contrast, be (for example) about 5 volts.

If the difference of voltages is greater than the threshold voltage at step 308, the current output from alternator 14 is suspended or limited, in view of the faulty connection, at step 310. The suspension or limitation can be performed by engine controller 18 reducing the commanded voltage on regulator control circuit 30. Also, a dedicated signal can be provided between engine controller 18 and voltage regulator 16 (either via a dedicated wire or multiplexed on regulator control circuit 30) through which engine controller 18 can command voltage regulator 16 to suspend generation of output current.

It should be noted that in normal operation of alternator 14, the voltage at output 20 of rectifier 143 undergoes significant fluctuation, up to about 3 volts. This is at least in part due to the output current from alternator 14 being the result of rectification of three alternating current waveforms produced by stator 141. In order to allow the present invention to operate with greater precision and to avoid false indications of a faulty connection (i.e., "false positives"), the voltage threshold used at step 308 can be a function of the output current of alternator 14. Thus, for a given resistance which would indicate a faulty connection between output terminal 21 and conductor 23, the threshold voltage for detecting that fault will be larger for a larger output current.

Figure 3:
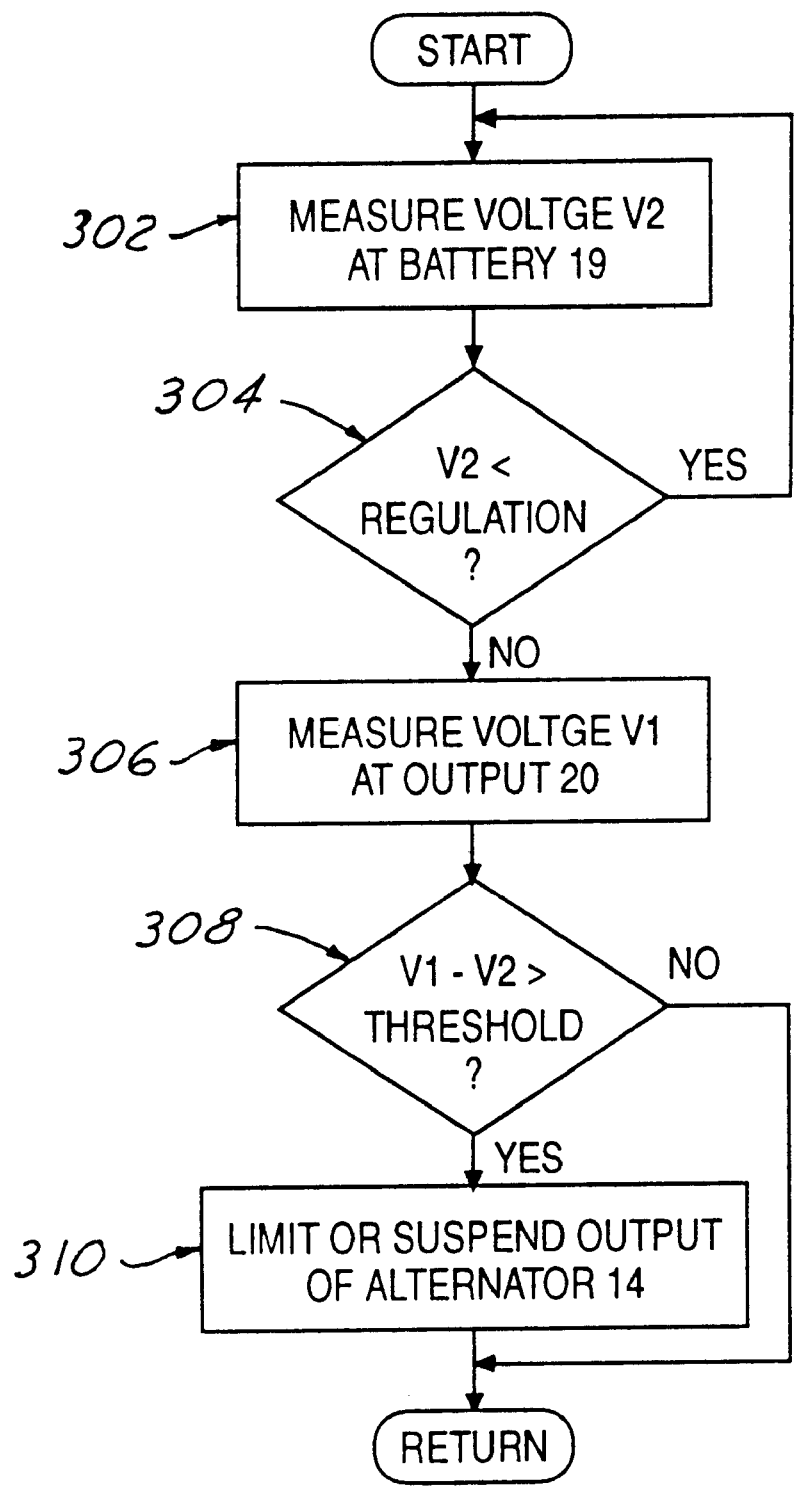
FIG. 3 is a flowchart showing a fault diagnosis routine performed within voltage regulator 16.

To further ensure against "false positives", the algorithm of FIG. 3 can be modified to require that at step 310, the difference of voltages must be above the threshold for at least a predetermined time before taking action to limit or suspend the output current of alternator 14.

To prevent engine controller 18 from permanently suspending or limiting current output from alternator 14 in the event of a "false positive", engine controller 18 can periodically re-enable normal operation of alternator 14. Engine controller 18 would do this by resuming its normal voltage commands to voltage regulator 16 on regulator control circuit 30. If the fault reappears, engine controller 18 would again limit or suspend the output of alternator 14. Engine controller 18 could retry enabling normal voltage commands to voltage regulator 16 a predetermined number of times and then conclude that the suspension or limitation of output should be permanent (until a vehicle repair is made).

Figure 4:
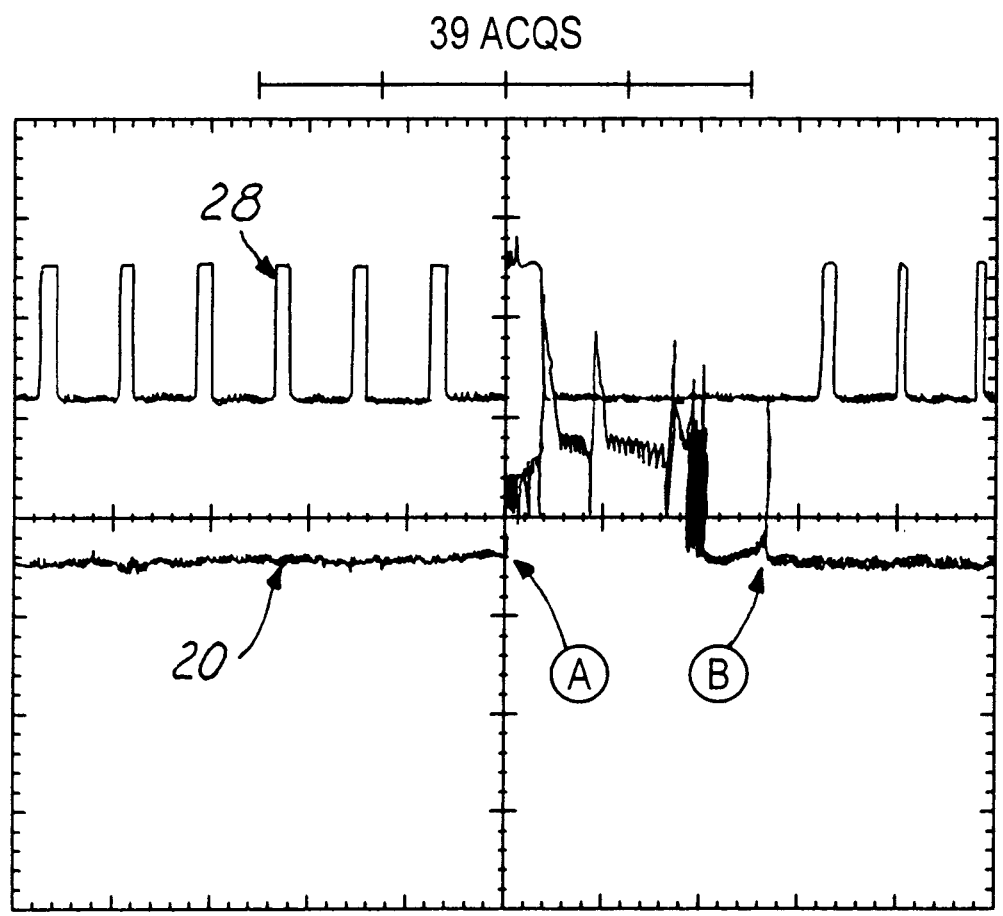
FIG. 4 is a graph containing two traces illustrative of an intermittently faulty connection between alternator output terminal 21 and conductor 23 in charging system 10.

A fault at the connection between output terminal 21 and conductor 23 can also be in the form of an intermittent open circuit fault. Such an intermittent open circuit fault can be caused by a loosened fastener coupling conductor 23 to output terminal 21. An intermittent open-circuit fault can produce the waveforms shown in FIG. 4. The lower trace shows the voltage at output 20 of rectifier 143, while the upper trace shows the signal on load indicator circuit 28. When the voltage at output 20 of rectifier 143 rises in view of the intermittent open circuit (indicated as point "A" on the graph), voltage regulator 16 recognizes the rise and holds the signal on load indicator circuit 28 LOW. The voltage at output 20 of rectifier 143 rises in the event of the intermittent fault because voltage regulator 16 attempts to control the output of alternator 14 to ensure that the voltage at the positive terminal of battery 19 is at the predetermined target voltage. When the intermittent open-circuit fault no longer exists (indicated at point "B"), the signal on load indicator circuit 28 resumes its normal function. With an intermittent fault such as this, engine controller 18 could retry enabling alternator 14 a predetermined number of times. If the fault recurs beyond this number of times, a final determination that a fault exists could be made. Engine controller 18 could permanently limit or suspend the output of alternator 14, illuminate fault indication lamp 25 and set a diagnostic code in memory to log the fault for retrieval by repair personnel.

While a faulty connection between output terminal 21 and conductor 23 has been discussed herein, any faulty connections between output terminal 21 and battery 19 can equivalently be diagnosed by systems according to the present invention. For example, the output of alternator 14 may be provided to a junction box, from which it is then provided to battery 19. A faulty connection to the junction box in such a configuration can be diagnosed by the present invention.

Various other modifications and variations will no doubt occur to those skilled in the arts to which this invention pertains. Such variations which generally rely on the teachings through which this disclosure has advanced the art are properly considered within the scope of this invention. This disclosure should thus be considered illustrative, not limiting; the scope of the invention is instead defined by the following claims.

What is claimed is:

1. A fault detection method for a motor vehicle charging system including a generator and an electrical component coupled to receive electrical current from an output of said generator, said method comprising the steps of:

(a) sensing a first voltage at an output of said generator;

(b) sensing a second voltage at said electrical component; and (c) comparing a difference of said first voltage and said second voltage to a predetermined voltage, said predetermined voltage indicative of a high resistance connection between said output of said generator and said component; and (d) if said difference is greater than said predetermined voltage, reducing or suspending output of electrical current from said generator.

2. A fault detection method as recited in claim 1, further comprising:

(e) a predetermined period of time after reducing or suspending output of electrical power from said generator, ending said reduction or suspension and repeating said steps (a) through (d).

3. A fault detection method as recited in claim 2, further comprising:

after performing said step (e) for a predetermined number of times, logging a diagnostic code in memory and/or illuminating a diagnostic indicator.

4. A fault detection method as recited in claim 2, wherein said electrical component is a battery.

5. A fault detection method as recited in claim 2, wherein:

said generator is controlled by a voltage regulator which is responsively coupled to a powertrain controller; and said step of reducing or suspending output of electrical current from said generator comprises the powertrain controller providing a signal to the voltage regulator commanding such reduction or suspension.

6. A fault detection method as recited in claim 2, wherein:
said generator is controlled by a voltage regulator which receives a commanded voltage from a powertrain controller; and
said step of reducing or suspending output of electrical current from said generator comprises the powertrain controller reducing said commanded voltage.

7. A fault detection method as recited in claim 6, wherein:
said steps (a) and (b) are performed by said voltage regulator; and
if said first voltage and said second voltage differ by more than said predetermined amount, said voltage regulator provides a fault signal to said powertrain controller.

8. A fault detection method as recited in claim 2, wherein:
said generator is controlled by a voltage regulator which receives a commanded voltage from a powertrain controller;
said steps (a) and (b) are performed by said voltage regulator; and
if said first voltage and said second voltage differ by more than said predetermined amount, said voltage regulator provides a fault signal to said powertrain controller.

9. A fault detection method as recited in claim 2, wherein said predetermined amount is a function of an output current of said generator.

10. A fault detection method as recited in claim 5, wherein said predetermined amount is a function of an output current of said alternator.

11. A fault detection method as recited in claim 7, wherein said predetermined amount is a function of an output current of said alternator.

12. A fault detection method for a motor vehicle charging system including a generator and an electrical component coupled to receive electrical current from said generator, said method comprising the steps of:
(a) sensing a first voltage at an output of said generator;
(b) sensing a second voltage at said electrical component; and
(c) if said first voltage and said second voltage differ by more than a predetermined amount, said predetermined amount being a function of an output current of said generator, reducing or suspending output of electrical current from said generator.

13. A fault detection method as recited in claim 12, further comprising:
(d) a predetermined time after reducing or suspending output of electrical power from said generator, ending said reduction or suspension and repeating said steps (a) through (c).

14. A fault detection method as recited in claim 13, wherein:
said generator is controlled by a voltage regulator which is responsively coupled to a powertrain controller; and
said step of reducing or suspending output of electrical current from said generator comprises the powertrain controller providing a signal to the voltage regulator commanding such reduction or suspension.

15. A fault detection method as recited in claim 14, wherein:
said steps (a) and (b) are performed by said voltage regulator; and
if said first voltage and said second voltage differ by more than said predetermined amount, said voltage regulator provides a fault signal to said powertrain controller.

16. A fault detection method as recited in claim 15, further comprising:
after performing said step (d) for a predetermined number of times, logging a diagnostic code in memory and/or illuminating a diagnostic indicator.

17. A fault detection method for a motor vehicle charging system including a generator, a voltage regulator operatively coupled to said generator, an electrical component coupled to receive electrical current from said generator and a powertrain controller, said method comprising the steps of:
(a) if said charging system has an operational fault, providing a fault indicating signal from said voltage regulator to said powertrain controller indicative of said operational fault; and
(b) if said signal intermittently indicates said operational fault, providing a first charging system control signal from said powertrain controller to said voltage regulator to limit or suspend output of said generator.

18. A method as recited in claim 17, wherein said operational fault is an open circuit at an output of said generator.

19. A method as recited in claim 18, further comprising:
(d) providing a second charging system control signal from said powertrain controller to said voltage regulator to end said limiting or suspension of output of said generator; and
continuing to perform steps (a) through (c).

20. A method as recited in claim 19, wherein said fault-indicating signal, said first charging system control signal and said second charging system control signal are pulse-width modulated.

* * * * *